United States Patent
Tanobe et al.

(10) Patent No.: US 12,066,736 B2
(45) Date of Patent: Aug. 20, 2024

(54) OPTICAL MODULE

(71) Applicant: Nippon Telegraph and Telephone Corporation, Tokyo (JP)

(72) Inventors: Hiromasa Tanobe, Tokyo (JP); Josuke Ozaki, Tokyo (JP)

(73) Assignee: Nippon Telegraph and Telephone Corporation, Tokyo (JP)

(*) Notice: Subject to any disclaimer, the term of this patent is extended or adjusted under 35 U.S.C. 154(b) by 211 days.

(21) Appl. No.: 17/772,891

(22) PCT Filed: Oct. 29, 2019

(86) PCT No.: PCT/JP2019/042294
§ 371 (c)(1),
(2) Date: Apr. 28, 2022

(87) PCT Pub. No.: WO2021/084602
PCT Pub. Date: May 6, 2021

(65) Prior Publication Data
US 2022/0357629 A1 Nov. 10, 2022

(51) Int. Cl.
*G02F 1/21* (2006.01)
*G02F 1/225* (2006.01)

(52) U.S. Cl.
CPC ............ *G02F 1/212* (2021.01); *G02F 1/2257* (2013.01)

(58) Field of Classification Search
CPC ....... G02F 1/212; G02F 1/2255; G02F 1/2257
See application file for complete search history.

(56) References Cited

U.S. PATENT DOCUMENTS

| | | | |
|---|---|---|---|
| 6,735,353 | B2 | 5/2004 | Hirata et al. |
| 9,046,703 | B2* | 6/2015 | Fukuda ................. G02F 1/2257 |
| 2015/0063809 | A1* | 3/2015 | Sugiyama ............. G02F 1/2255 |
| | | | 385/2 |
| 2021/0026217 | A1 | 1/2021 | Miyazaki et al. |

FOREIGN PATENT DOCUMENTS

| | | |
|---|---|---|
| JP | 10-073791 A | 3/1998 |
| JP | 2003222826 A | 8/2003 |
| JP | 2004228432 A | 8/2004 |
| JP | 2005234267 A | 9/2005 |
| WO | 2019187625 A1 | 10/2019 |

OTHER PUBLICATIONS

K. Prosyk et al., "Travelling Wave Mach-Zehnder Modulators", The 25th International Conference on Indium Phosphide and Related Materials, May 19-23, 2013, IEEE, Kobe, Japan, 2 pages.

* cited by examiner

*Primary Examiner* — Omar R Rojas
(74) *Attorney, Agent, or Firm* — Slater Matsil, LLP

(57) ABSTRACT

An optical module includes: a Peltier module; an optical semiconductor element mounted on the Peltier module; and a driver that drives high-frequency lines of the optical semiconductor element. The optical semiconductor element includes: optical circuits providing a function of an optical interferometer and the high-frequency lines. Cooling performance of the Peltier module in a region in vicinity of the driver is higher than the cooling performance in other regions.

13 Claims, 13 Drawing Sheets

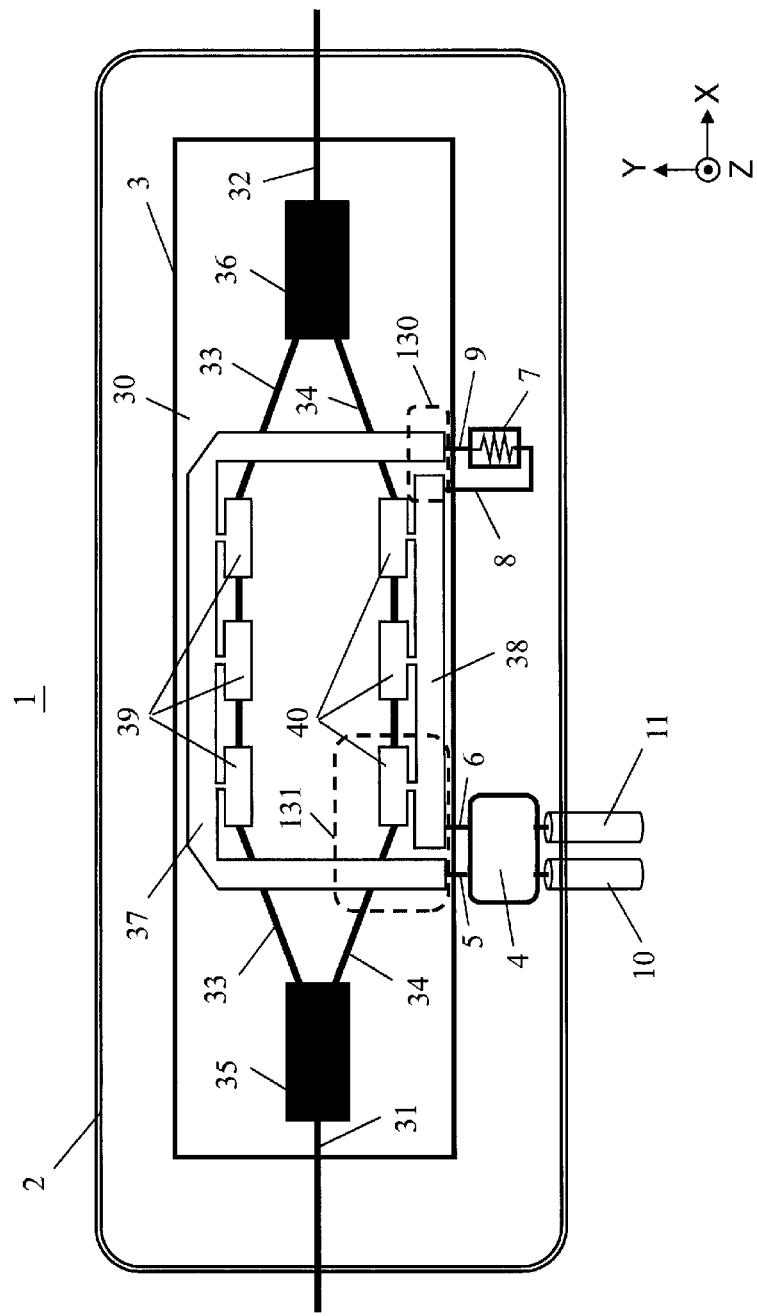

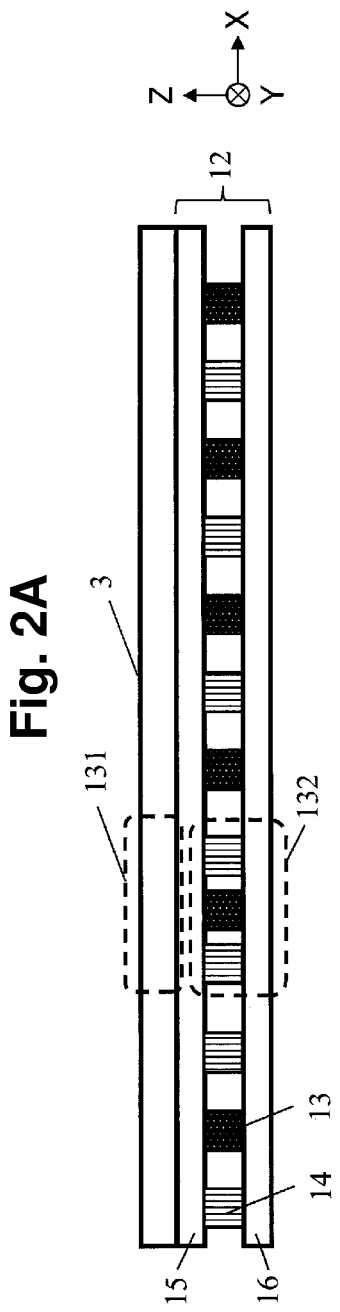

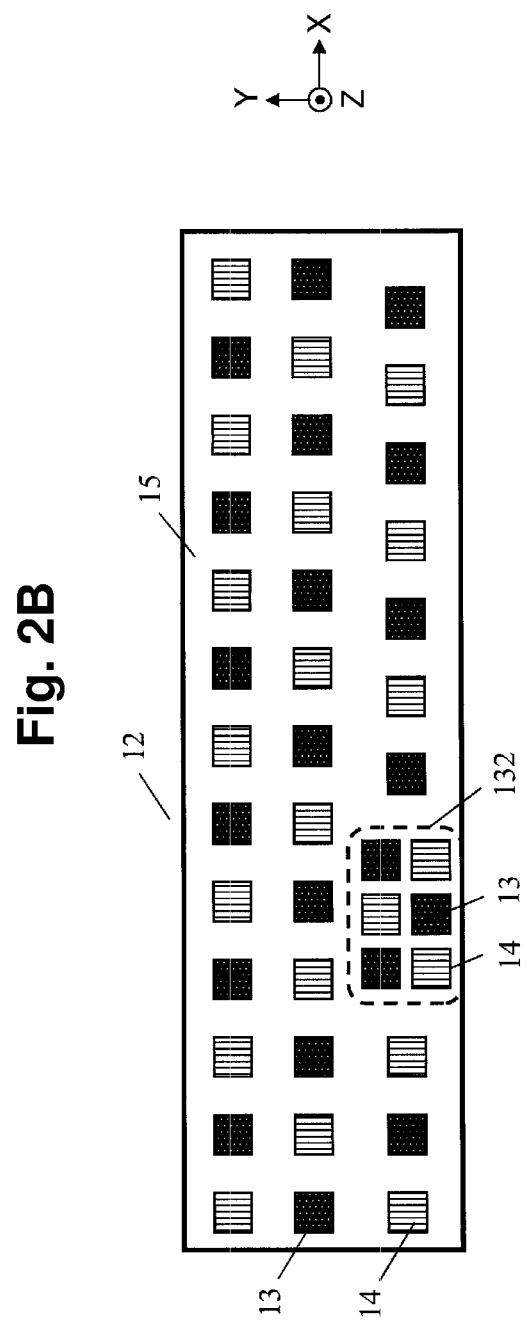

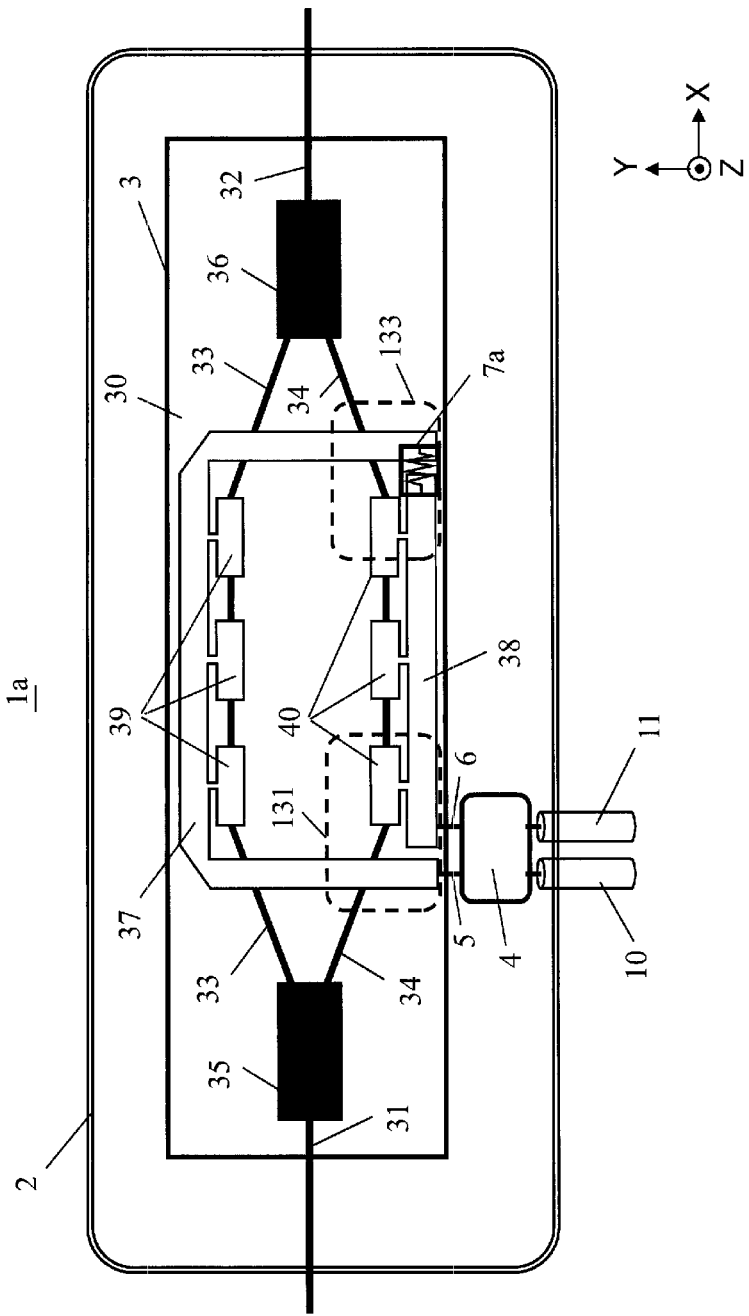

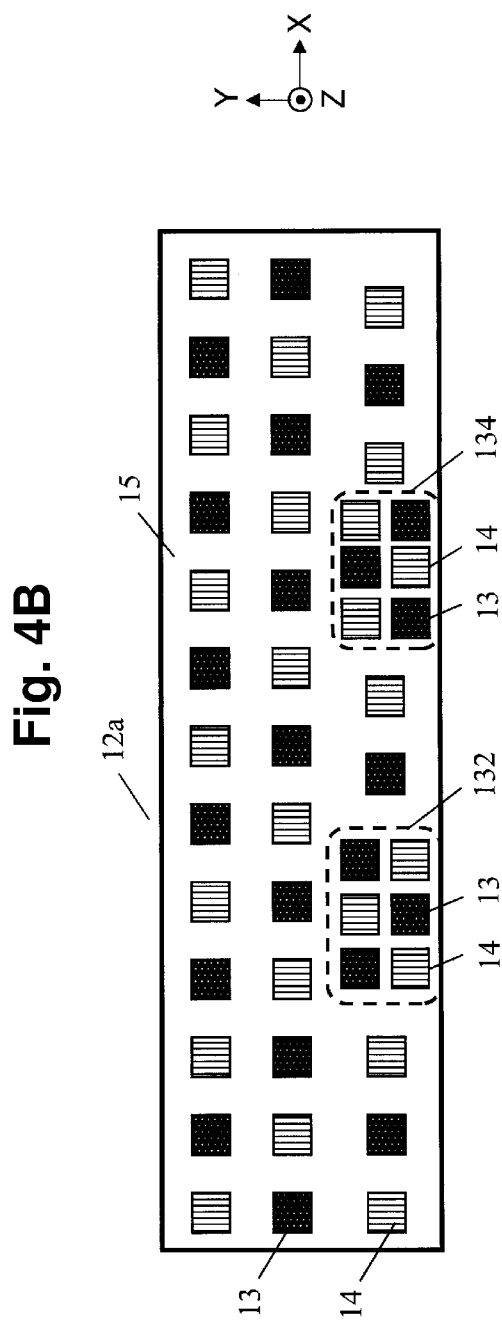

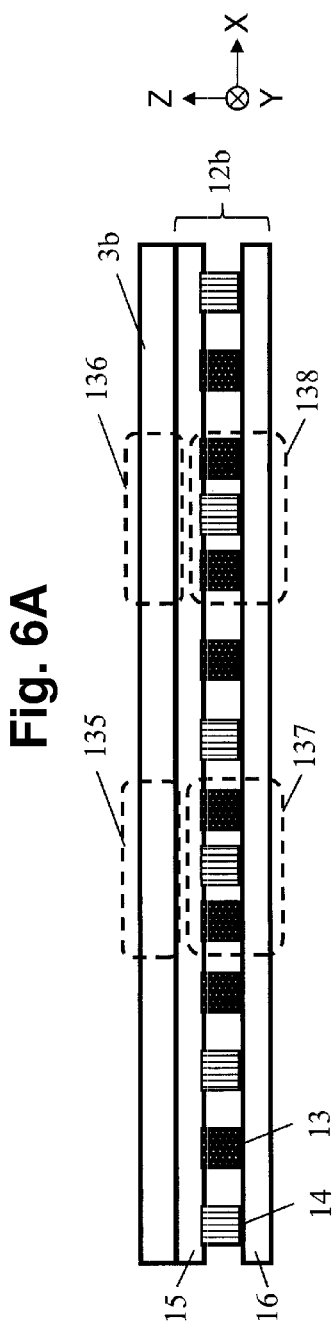

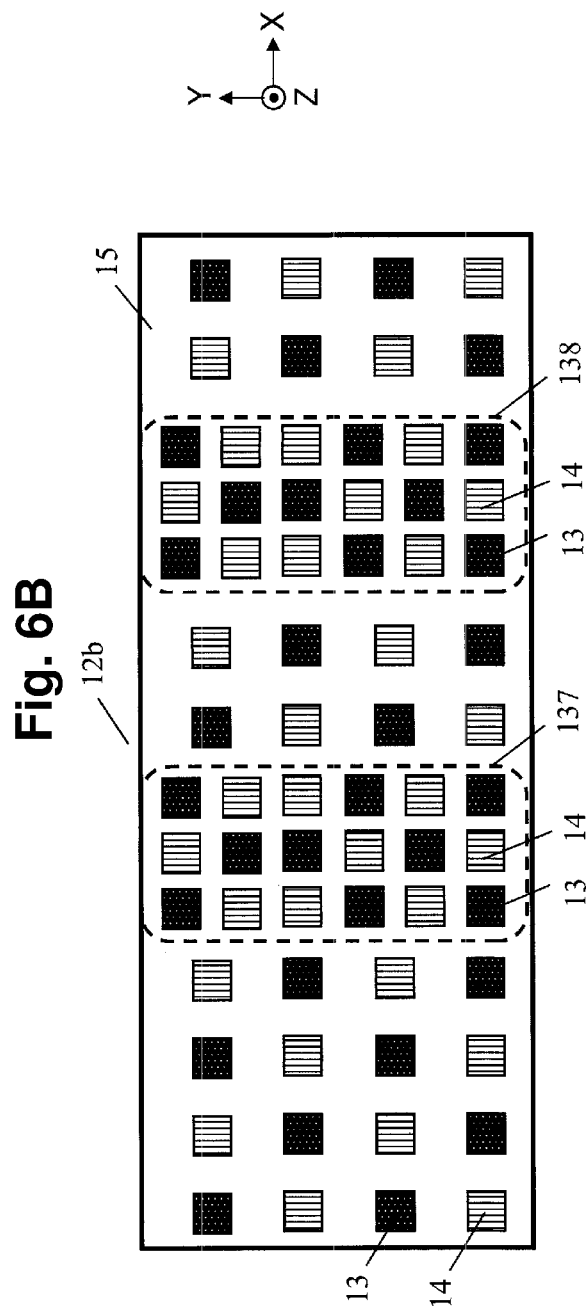

OPTICAL MODULE

CROSS-REFERENCE TO RELATED APPLICATIONS

This application is a national phase entry of PCT Application No. PCT/JP2019/042294, filed on Oct. 29, 2019, which application is hereby incorporated herein by reference.

TECHNICAL FIELD

The present invention relates to an optical module in which an optical semiconductor element and an active element driving a high-frequency circuit of the optical semiconductor element are mounted in a single housing, an optical module in which an optical semiconductor element and a terminator terminating a high-frequency circuit of the optical semiconductor element are mounted in a single housing, and an optical module in which an optical semiconductor element, an active element, and a terminator are mounted in a single housing.

BACKGROUND

In the field of optical communication technology, an optical modulator has been a key device. Especially in recent years, with increase of the baud rate, integration technology of mounting a driver and an optical modulator in a single housing is being actively developed, for the purpose of improving, through mounting technique, driving performance of a driver driving the optical modulator.

Conventionally, the driver has been treated as a discrete component physically independent from the optical modulator. The driver and the optical modulator have been mounted to be serially connected to each other on a low-loss printed substrate. However, in this case, high-frequency loss is caused due to the driver and the optical modulator being mounted in different housings. In addition, loss is caused by a high-frequency line formed on the print substrate, leading to a problem of impairment of effective driving performance of the driver with respect to the optical modulator.

Given this, in recent years, development is being carried out by a method of integrating the driver and the optical modulator and mounting as a whole in a single housing. Such integration of the driver and the optical modulator is drawing attention particularly recently, as a technique of enabling both improvement of the driving performance of the driver and reduction in size.

However, since the optical modulator is based on the Mach-Zehnder optical interferometer, an influence from integration of the driver and the optical modulator is unavoidable in temperature management of the optical semiconductor mounted with the optical modulator. Specifically, since a refractive index of an optical waveguide constituting the Mach-Zehnder optical interferometer is changed with temperature, the change in the refractive index alters the function as the optical interferometer and disturbs the very interference condition, resulting in impairment of the function as the optical modulator. Such impairment of the function of the optical modulator draws attention as a novel problem to be solved in the case of integration of the heat-generative driver with the optical modulator.

FIG. 7 is a plan view of an optical module mounted with an optical modulator disclosed in Non-patent Literature 1. Note that the bias circuit and the like are not shown in the figure for the sake of convenience of description. Inside a housing 100 of the optical module: an optical semiconductor element 101 mounted with the Mach-Zehnder optical modulator; a high-frequency lines 103, 104 that connect an external driver 102 with the optical semiconductor element 101; a terminator 105 that terminates the high-frequency lines of the optical semiconductor element 101; and gold wires 106, 107 that connect the high-frequency lines of the optical semiconductor element 101 with the terminator 105 are provided.

The optical semiconductor element 101 includes: an input optical waveguide 110; an output optical waveguide in; two optical waveguides 112, 113 constituting the Mach-Zehnder optical modulator; an optical demultiplexer 114 demultiplexing light propagating along the input optical waveguide no to the two optical waveguides 112, 113; an optical multiplexer 115 multiplexing light propagating along the two optical waveguides 112, 113 to the output optical waveguide 111; and capacity-loaded high-frequency lines 116, 117.

A driving signal output from the driver 102 provided outside the housing 100 is transmitted via the high-frequency lines 103, 104 to the capacity-loaded high-frequency lines 116, 117 of the optical semiconductor element 101. Electrodes 118, 119 of the capacity-loaded high-frequency lines 116, 117 have a structure for adding capacity to the high-frequency lines. The electrodes 118, 119 apply the driving signal to the optical waveguides 112, 113. Applying the driving signal to the optical waveguides 112, 113 changes the refractive index in the optical waveguides 112, 113, and in turn changes the phase of light. Creating a voltage difference between the optical waveguides 112, 113 changes interference of light in the optical multiplexer 115, enabling modulation of light.

The driving signal having propagated along the capacity-loaded high-frequency lines 116, 117 is converted into heat at the terminator 105. The heat generated in the terminator 105 is transmitted via the gold wires 106, 107 to the optical semiconductor element 101, whereby the optical semiconductor element 101 is locally heated. In FIG. 7, the locally heated region is indicated as a high-temperature region 130. The high-temperature region 130 is spatially distant from the two optical waveguides 112, 113 constituting the Mach-Zehnder optical modulator, and is therefore relatively less likely to disturb the interference condition in the Mach-Zehnder optical modulator. Consequently, through control of the entire optical semiconductor element 101 uniformly at a constant temperature, the function as the Mach-Zehnder optical modulator is sufficiently provided.

FIG. 8 is a diagram schematically showing an operation of optical modulation by the optical module shown in FIG. 7. In FIG. 8, A indicates extinction characteristics of the Mach-Zehnder optical modulator changing sinusoidally with respect to voltage. Lout is an optical modulation signal output from the Mach-Zehnder optical modulator. As shown in FIG. 8, a driving signal Vin, which undergoes a voltage change around a bias point B, is input to the Mach-Zehnder optical modulator. With the bias point B being a midpoint of the extinction characteristics, high linearity is ensured for conversion characteristics between the driving signal Vin and the optical modulation signal Lout. It is well known that, under such an operation condition, the optical modulation signal Lout provides favorable characteristics with signal distortion being sufficiently suppressed.

FIG. 9 shows a structure of the optical module, with the basic structure of the optical module shown in FIG. 7, in which the driver 102 is mounted inside the housing. The driver 102 applies the driving signal, which is input via high-frequency lines 120, 121 from the outside, to the capacity-loaded high-frequency lines 116, 117. The heat generated in the driver 102 is transmitted to the optical semiconductor element 101 via gold wires 122, 123 electrically connecting the end portions of the capacity-loaded high-frequency lines 116, 117 with the driver 102, whereby the optical semiconductor element 101 is locally heated.

In FIG. 9, the locally heated region is indicated as a high-temperature region 131. This local heating involves a region of the optical waveguide 113 of the two optical waveguides 112, 113 constituting the Mach-Zehnder optical modulator, and is therefore an event causing concern especially with a semiconductor material which has temperature characteristics for its refractive index. The concern is raised because the interference condition of the Mach-Zehnder optical modulator may be disturbed.

FIG. 10 is a diagram schematically showing operation of optical modulation by the optical module shown in FIG. 9. After re-adjustment of the bias point B and acquisition of a new midpoint of the extinction characteristics, the driving signal Vin, which undergoes a voltage change around the bias point B, is input to the Mach-Zehnder optical modulator. With the bias point B being a midpoint of the extinction characteristics, high linearity is ensured for conversion characteristics between the driving signal Vin and the optical modulation signal Lout. Therefore, under the operation condition shown in FIG. 10, the optical modulation signal Lout providing favorable characteristics with signal distortion being sufficiently suppressed can be obtained in the configuration shown in FIG. 9 as well.

However, as is obvious from comparison between FIG. 8 and FIG. 10, in the configuration shown in FIG. 9, the extinction ratio is deteriorated in the extinction characteristics A of the Mach-Zehnder optical modulator. As a result, the extinction ratio of the optical modulation signal Lout is also naturally deteriorated.

FIG. 11 shows a case in which the bias point B is not set at the midpoint of the extinction characteristics. In this case, as is obvious from FIG. 11, the optical modulation signal Lout is distorted, and signal quality is deteriorated in the case of using the Mach-Zehnder optical modulator in the optical transmitter.

As explained in the foregoing, in the optical module in which the Mach-Zehnder optical modulator and the driver are integrated, the current system still has problems, and there has been a demand for a solution to distortion of the optical modulating signal caused by heat generated in the driver.

CITATION LIST

Non-Patent Literature

Non-Patent Literature 1: K. Prosyk, A. Ait-Ouali, J. Chen, M. Hamacher, D. Hoffmann, R. Kaiser, R. Millett, A. Pirastu, M. Totolo, K. Velthaus, I. Woods, "Travelling Wave Mach-Zehnder Modulators", Proceedings Int. Conf. on InP and Related Materials, Kobe, Japan, MoD3-1, 2013

SUMMARY

Technical Problem

Embodiments of the present invention have been made for solving the aforementioned problems, and the objective of embodiments of the present invention is to achieve a stable operation of an optical module.

Means for Solving the Problem

The optical module according to embodiments of the present invention includes: a cooling element; an optical semiconductor element mounted on the cooling element; and an active element configured to drive a high-frequency circuit of the optical semiconductor element, in which: the optical semiconductor element includes an optical circuit providing a function of an optical interferometer and the high-frequency circuit formed on a surface of the optical circuit; and cooling performance of the cooling element is higher in a region in vicinity of the active element than in other regions.

In addition, the optical module according to embodiments of the present invention includes: a cooling element; an optical semiconductor element mounted on the cooling element; and a terminator configured to terminate a high-frequency circuit of the optical semiconductor element, in which: the optical semiconductor element includes an optical circuit providing a function of an optical interferometer and the high-frequency circuit formed on a surface of the optical circuit; and cooling performance of the cooling element is higher in a region in vicinity of the terminator than in other regions.

In addition, the optical module according to embodiments of the present invention includes: a cooling element; an optical semiconductor element mounted on the cooling element; an active element configured to drive a high-frequency circuit of the optical semiconductor element; and a terminator configured to terminate the high-frequency circuit, in which: the optical semiconductor element includes an optical circuit providing a function of an optical interferometer and the high-frequency circuit formed on a surface of the optical circuit; and cooling performance of the cooling element is higher in a region in vicinity of the active element and a region in vicinity of the terminator than in other regions.

Effects of Embodiments of the Invention

According to embodiments of the present invention, the higher cooling performance of the cooling element in the region in vicinity of the active element than the cooling performance in other regions enables uniformization of an in-plane temperature distribution of the optical semiconductor element and in turn suppression of variation in the interference condition of the optical interferometer even during operation where constant heat inflow from the active element to the optical semiconductor element occurs, whereby the stable operation of an optical module can be achieved.

In addition, according to embodiments of the present invention, the higher cooling performance of the cooling element in the region in vicinity of the terminator than the cooling performance in other regions enables uniformization of an in-plane temperature distribution of the optical semiconductor element even during operation where constant heat inflow from the terminator to the optical semiconductor element occurs, whereby the stable operation of an optical module can be achieved.

Furthermore, according to embodiments of the present invention, the higher cooling performance of the cooling element in the region in vicinity of the active element and the region in vicinity of the terminator than the cooling performance in other regions enables uniformization of an in-plane temperature distribution of the optical semiconductor element even during operation where constant heat inflow from the active element and the terminator to the optical semiconductor element occurs, whereby the stable operation of an optical module can be achieved.

BRIEF DESCRIPTION OF THE DRAWINGS

FIG. 1 is a plan view of an optical module according to a first embodiment of the present invention.

FIG. 2A is a lateral view of an optical semiconductor element and a Peltier module according to the first embodiment of the present invention.

FIG. 2B is a plan view of the Peltier module according to the first embodiment of the present invention.

FIG. 3 is a plan view of an optical module according to a second embodiment of the present invention.

FIG. 4B is a plan view of the Peltier module according to the second embodiment of the present invention.

FIG. 6A is a lateral view of an optical semiconductor element and a Peltier module according to the third embodiment of the present invention.

FIG. 6B is a plan view of the Peltier module according to the third embodiment of the present invention.

DETAILED DESCRIPTION OF ILLUSTRATIVE EMBODIMENTS

Figure 4A:
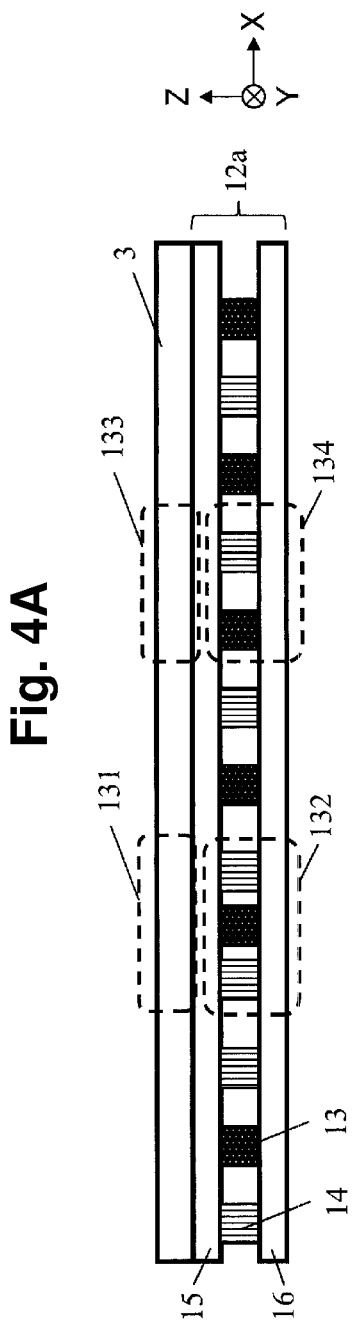
FIG. 4A is a lateral view of an optical semiconductor element and a Peltier module according to the second embodiment of the present invention.

Hereinafter, embodiments of the present invention are described in detail with reference to the drawings.

First Embodiment

FIG. 1 is a plan view of an optical module according to a first embodiment of the present invention. Inside a housing 2 of an optical module 1 according to the present embodiment: a Peltier module (cooling element) described later; an optical semiconductor element 3 mounted on the Peltier module; a driver 4 (active element) that drives high-frequency lines of the optical semiconductor element 3; gold wires 5, 6 that connect input ends of the high-frequency lines of the optical semiconductor element 3 with the driver 4; a terminator 7 that terminates the high-frequency lines of the optical semiconductor element 3; and gold wires 8, 9 that connect output ends of the high-frequency lines of the optical semiconductor element 3 with the terminator 7 are provided.

The optical semiconductor element 3 is provided with a Mach-Zehnder optical modulator 30. The Mach-Zehnder optical modulator 30 includes: an optical circuit providing a function of an optical interferometer; and capacity-loaded high-frequency lines (high-frequency circuit) 37, 38 formed on a surface of the optical circuit. The optical circuit includes: an input optical waveguide 31; an output optical waveguide 32; two optical waveguides 33, 34; an optical demultiplexer 35 demultiplexing light propagating along the input optical waveguide 31 to the two optical waveguides 33, 34; and an optical multiplexer 36 multiplexing light propagating along the two optical waveguides 33, 34 to the output optical waveguide 32.

CW (continuous wave) light is input to the input optical waveguide 31 from outside of the housing. Light modulated by the Mach-Zehnder optical modulator 30 is output from the output optical waveguide 32.

The driver 4 applies the driving signal, which is input via high-frequency lines 10, 11 from outside of the housing, to the capacity-loaded high-frequency lines 37, 38. The gold wires 5, 6 electrically connect input ends of the capacity-loaded high-frequency lines 37, 38 with an output terminal of the driver 4.

Electrodes 39, 40 cyclically provided on the capacity-loaded high-frequency lines 37, 38 have a structure for adding capacity to the high-frequency lines. The electrodes 39, 40 apply a driving signal to the optical waveguides 33, 34. By applying the driving signal to the optical waveguides 33, 34, light propagating along the optical waveguides 33, 34 can be modulated. Capacity added by the electrodes 39, 40 to the high-frequency lines serves to match group velocity of the light propagating along the optical waveguides 33, 34 with group velocity of the driving signal (high-frequency signal).

The gold wires 8, 9 electrically connect output ends of the capacity-loaded high-frequency lines 37, 38 with the terminator 7. The driving signal having propagated along the capacity-loaded high-frequency lines 37, 38 is converted into heat at the terminator 7 without returning to the driver 4. The heat generated in the terminator 7 is transmitted via the gold wires 8, 9 to the optical semiconductor element 3, whereby the optical semiconductor element 3 is locally heated. In FIG. 1, the region heated by the heat transmitted via the gold wires 8, 9 is indicated as a high-temperature region 130.

The unit for electric power consumption of the driver 4 is typically W. The heat generated in the driver 4 is transmitted via the gold wires 5, 6 to the optical semiconductor element 3, whereby the optical semiconductor element 3 is locally heated. In FIG. 1, the region heated by the heat transmitted via the gold wires 5, 6 is indicated as a high-temperature region 131.

Heat distribution is thus generated in the optical semiconductor element 3 by the heat generation in the driver 4 and the terminator 7. Especially, since a high-temperature region 131 created by heat generation in the driver 4 overlaps with a region of the optical waveguide 34 of the two optical waveguides 33, 34 constituting the Mach-Zehnder optical modulator 30, asymmetrical heat distribution is generated in the two optical waveguides 33, 34.

Given this, in the present embodiment, the Peltier module provided immediately below the optical semiconductor element 3 uniformizes in-plane temperature distribution of the optical semiconductor element 3 during operation of the optical module 1.

FIG. 2A is a lateral view of the optical semiconductor element 3 and the Peltier module 12, and FIG. 2B is a plan view of the Peltier module 12. Note that the driver 4, the terminator 7, and the gold wires 5, 6, 8, 9 are omitted in FIG. 2A. In addition, electrodes of a thermoelectric semiconductor etc. of the Peltier module 12 are omitted in FIG. 2A. FIG. 2B shows a perspective view of the inside of the Peltier module 12.

As shown in FIG. 2A and FIG. 2B, the Peltier module 12 has a structure in which a plurality of pairs of p-type thermoelectric semiconductors 13 and n-type thermoelectric semiconductors 14 are arranged two-dimensionally, the p-type thermoelectric semiconductors 13 and the n-type thermoelectric semiconductors 14 being interposed between substrates 15, 16 made of insulating ceramic. The paired p-type thermoelectric semiconductors 13 and n-type thermoelectric semiconductors 14 are joined with an electrode (not illustrated). When electric current passes from the n-type thermoelectric semiconductors 14 to the p-type thermoelectric semiconductors 13, heat is absorbed from a surface of the substrate 15 on an upper side and conveyed, and then released to the substrate 16 on the other side. The optical semiconductor element 3 is mounted on the substrate 15 on a cooling side of the Peltier module 12.

In the present embodiment, an arrangement density of the p-type thermoelectric semiconductors 13 and the n-type thermoelectric semiconductors 14 constituting the Peltier module 12 is selectively changed. Specifically, in a region in the in-plane direction of a joint face between the Peltier module 12 and the optical semiconductor element 3, the pairs of p-type thermoelectric semiconductors 13 and n-type thermoelectric semiconductors 14 are densely arranged in a region 132 immediately below the high-temperature region 131 of the optical semiconductor element 3, while the pairs of p-type thermoelectric semiconductors 13 and n-type thermoelectric semiconductors 14 are sparsely arranged in regions other than the region 132. The joint face is an upper face of the substrate 15, which is an XY plane in FIG. 2B. In the present embodiment, such an arrangement selectively changes the cooling performance of the Peltier module 12 in such a way that the cooling performance in the region 132 in vicinity of the driver 4 is higher than the cooling performance in other regions.

As described above, in the present embodiment, the in-plane temperature distribution of the optical semiconductor element 3 can be uniformized during operation of the optical module 1 and the variation in the interference condition of the Mach-Zehnder optical modulator 30 can be suppressed, enabling stable operation of the Mach-Zehnder optical modulator 30.

Second Embodiment

Hereinafter, a second embodiment of the present invention is described. FIG. 3 is a plan view of an optical module according to the second embodiment of the present invention. Inside a housing 2 of an optical module 1a according to the present embodiment: a Peltier module (cooling element) described later; an optical semiconductor element 3 mounted on the Peltier module; a driver 4; gold wires 5, 6; and a terminator 7a.

The optical semiconductor element 3, the driver 4, and the gold wires 5, 6 are as described in the first embodiment.

As in the first embodiment, the terminator 7a terminates the capacity-loaded high-frequency lines 37, 38 of the Mach-Zehnder optical modulator 30 of the optical semiconductor element 3. The present embodiment is different from the first embodiment in that the terminator 7a is formed (monolithically integrated) on the surface of the optical semiconductor element 3, such that one end of the terminator 7a constituted of a thin film resistor is electrically connected to the output end of the capacity-loaded high-frequency line 37 and the other end of the terminator 7a is electrically connected to the output end of the capacity-loaded high-frequency line 38. Alternatively, the terminator 7a may be flip-chip mounted on the surface of the optical semiconductor element 3, such that one end of the terminator 7a constituted of a discrete component is electrically connected to the output end of the capacity-loaded high-frequency line 37 and the other end of the terminator 7a is electrically connected to the output end of the capacity-loaded high-frequency line 38.

The present embodiment eliminates the need for the gold wires 8, 9 unlike the first embodiment, whereby the reflection loss of the high-frequency signal can be suppressed.

However, heat generated in the terminator 7a is easily transferred to the optical semiconductor element 3. In FIG. 3, the region heated by the heat generation in the terminator 7a is indicated as a high-temperature region 133.

In the first embodiment there is only one high-temperature region 130, while in the present embodiment there are two high-temperature regions 130, 133. Especially in a case in which the driver 4 is an open collector type driver, electric current needs to be supplied from the terminator side for output of the driver 4, increasing heat generation in the terminator 7a. Since a high-temperature region 133 created by heat generation in the terminator 7a overlaps with a region of the optical waveguide 34 of the two optical waveguides 33, 34 constituting the Mach-Zehnder optical modulator 30, the heat generation in the terminator 7a is non-negligible.

Given this, in the present embodiment, the Peltier module provided immediately below the optical semiconductor element 3 uniformizes in-plane temperature distribution of the optical semiconductor element 3 during operation of the optical module 1a. FIG. 4A is a lateral view of the optical semiconductor element 3 and the Peltier module 12a, and FIG. 4B is a plan view of the Peltier module 12a. The driver 4, the terminator 7a, and the gold wires 5, 6 are omitted in FIG. 4A. In addition, electrodes of a thermoelectric semiconductor etc. of the Peltier module 12a are omitted in FIG. 4A. FIG. 4B shows a perspective view of the inside of the Peltier module 12a.

The operation principle of the Peltier module 12a is the same as that of the Peltier module 12 in the first embodiment. The optical semiconductor element 3 is mounted on the substrate 15 on a cooling side of the Peltier module 12a.

In the present embodiment, in a region in the in-plane direction of a joint face (the upper face of the substrate 15, which is the XY plane in FIG. 4B) of the Peltier module 12a with respect to the optical semiconductor element 3, the pairs of p-type thermoelectric semiconductors 13 and n-type thermoelectric semiconductors 14 are densely arranged in regions 132, 134 immediately below the two high-temperature regions 131, 133 of the optical semiconductor element 3, while the pairs of p-type thermoelectric semiconductors 13 and n-type thermoelectric semiconductors 14 are sparsely arranged in regions other than the regions 132, 134. In the present embodiment, such an arrangement selectively changes the cooling performance of the Peltier module 12 in such a way that the cooling performance in the region 132 in vicinity of the driver 4 and the region 134 in vicinity of the terminator 7a is higher than the cooling performance in other regions.

As described above, in the present embodiment, the in-plane temperature distribution of the optical semiconductor element 3 can be uniformized during operation of the optical module 1a and the variation in the interference condition of the Mach-Zehnder optical modulator 30 can be suppressed, enabling stable operation of the Mach-Zehnder optical modulator 30 as in the first embodiment.

Figure 7:
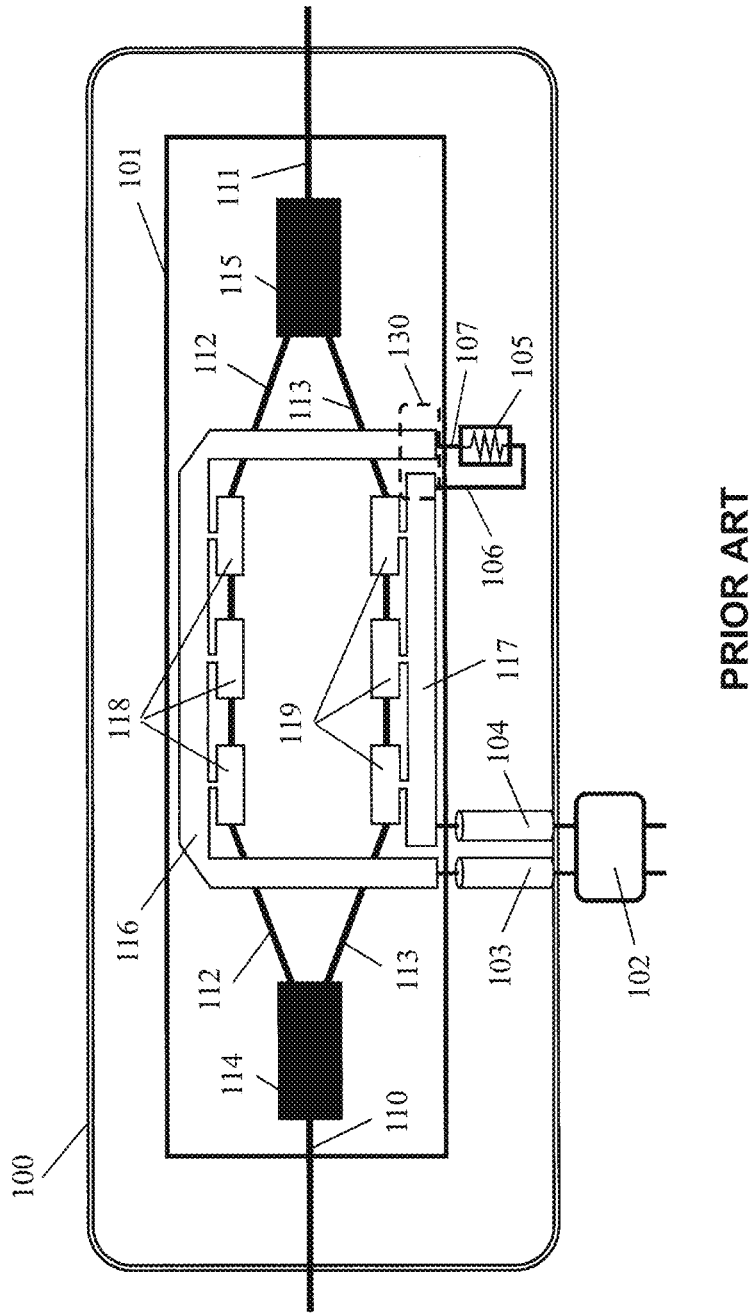
FIG. 7 is a plan view of a conventional optical module mounted with a Mach-Zehnder optical modulator.
Figure 8:
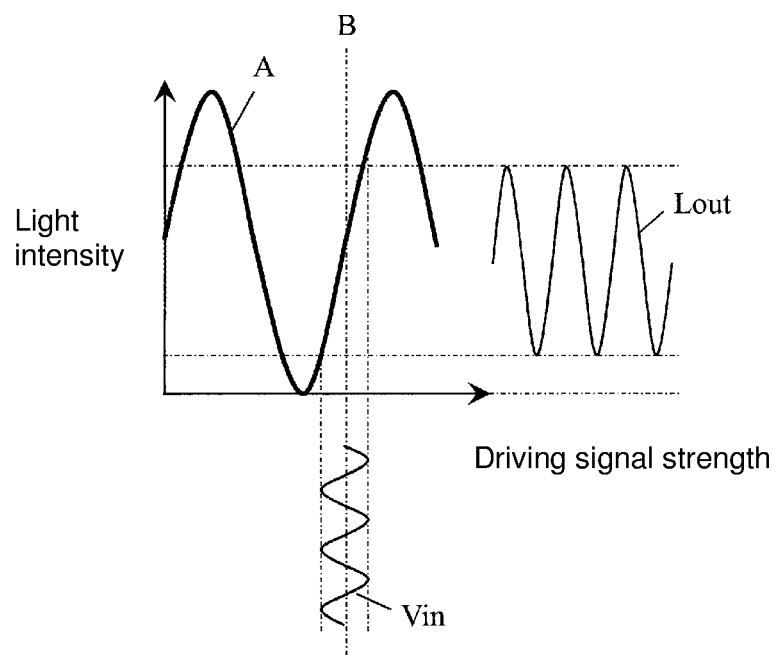
FIG. 8 is a diagram schematically showing an operation of optical modulation by the optical module shown in FIG. 7.
Figure 9:
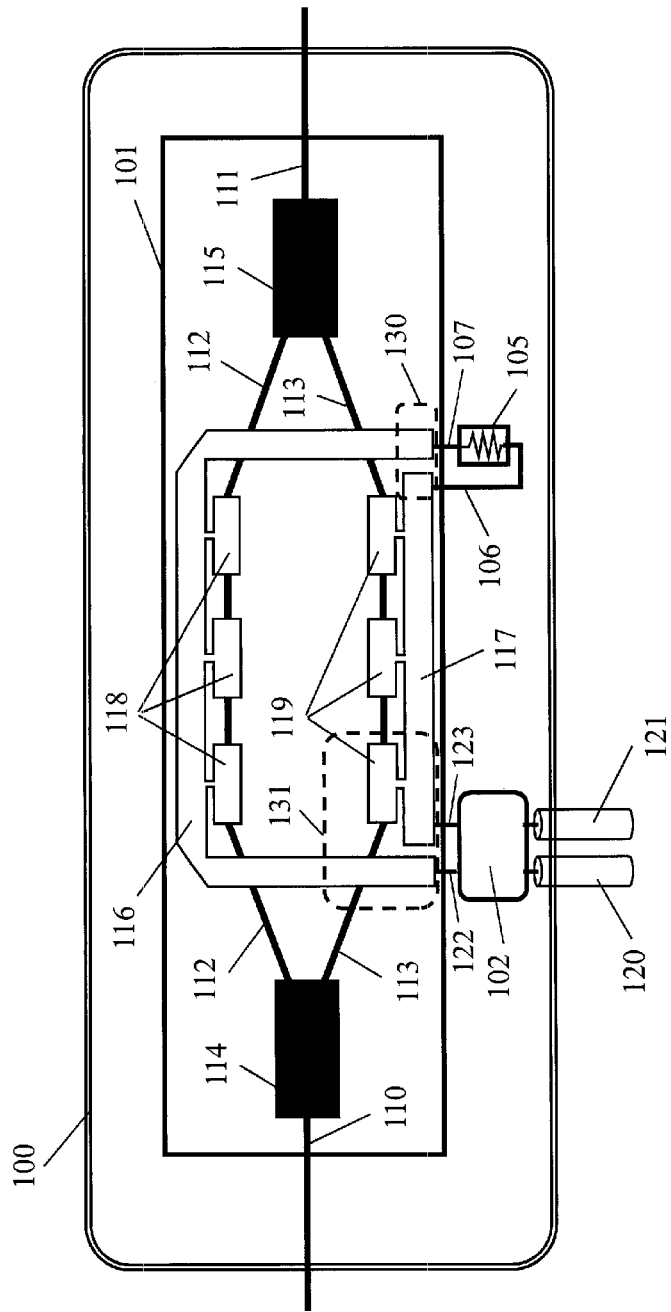
FIG. 9 is a plan view of an optical module with a driver mounted inside a housing.
Figure 10:
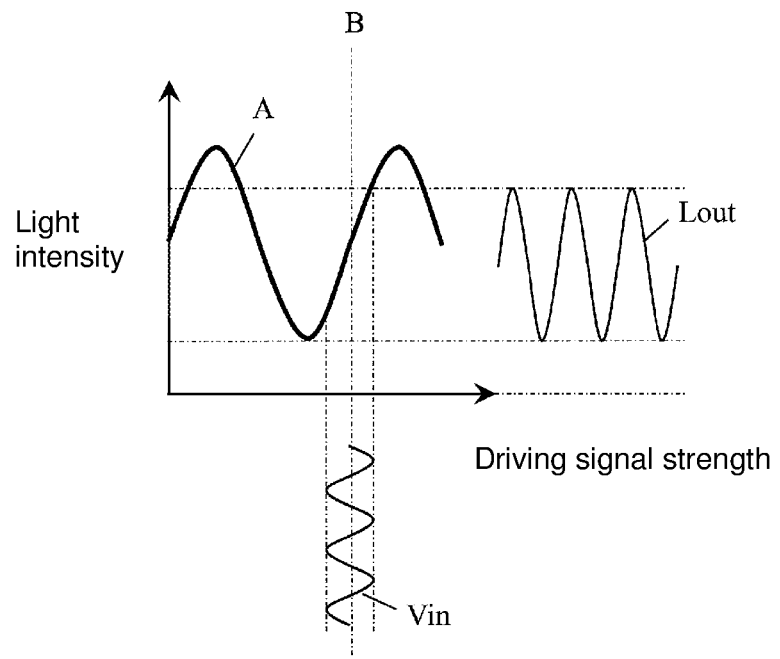
FIG. 10 is a diagram schematically showing an operation of optical modulation by the optical module shown in FIG. 9.
Figure 11:
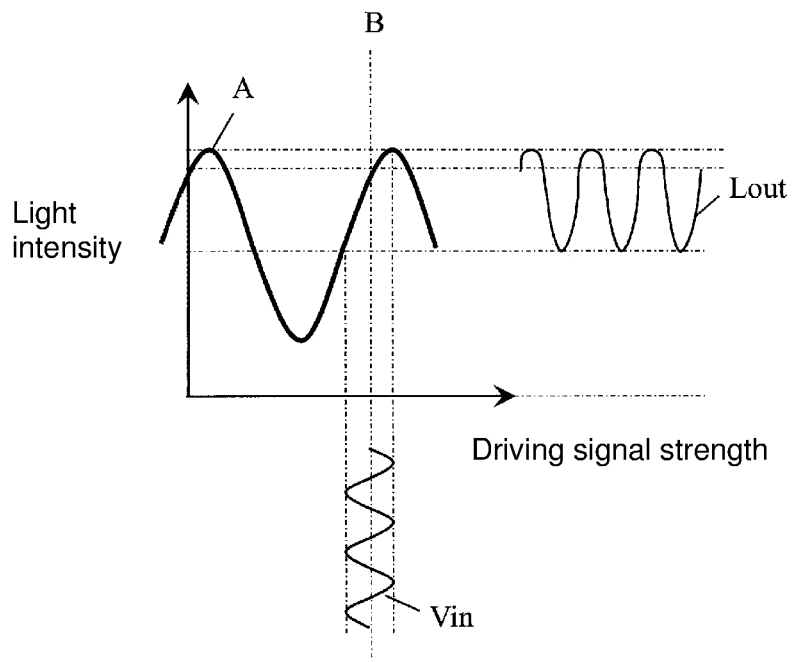
FIG. 11 is a diagram schematically showing another operation of optical modulation by the optical module shown in FIG. 9.

Note that, although the present embodiment is targeted at the optical module in which the optical semiconductor element 3, the driver 4, and the terminator 7a are mounted in a single housing, the present embodiment may also be applied to the optical module in which the driver is outside the housing as shown in FIG. 7. In this case, there is only one high-temperature region indicated by 133.

Third Embodiment

Figure 5:
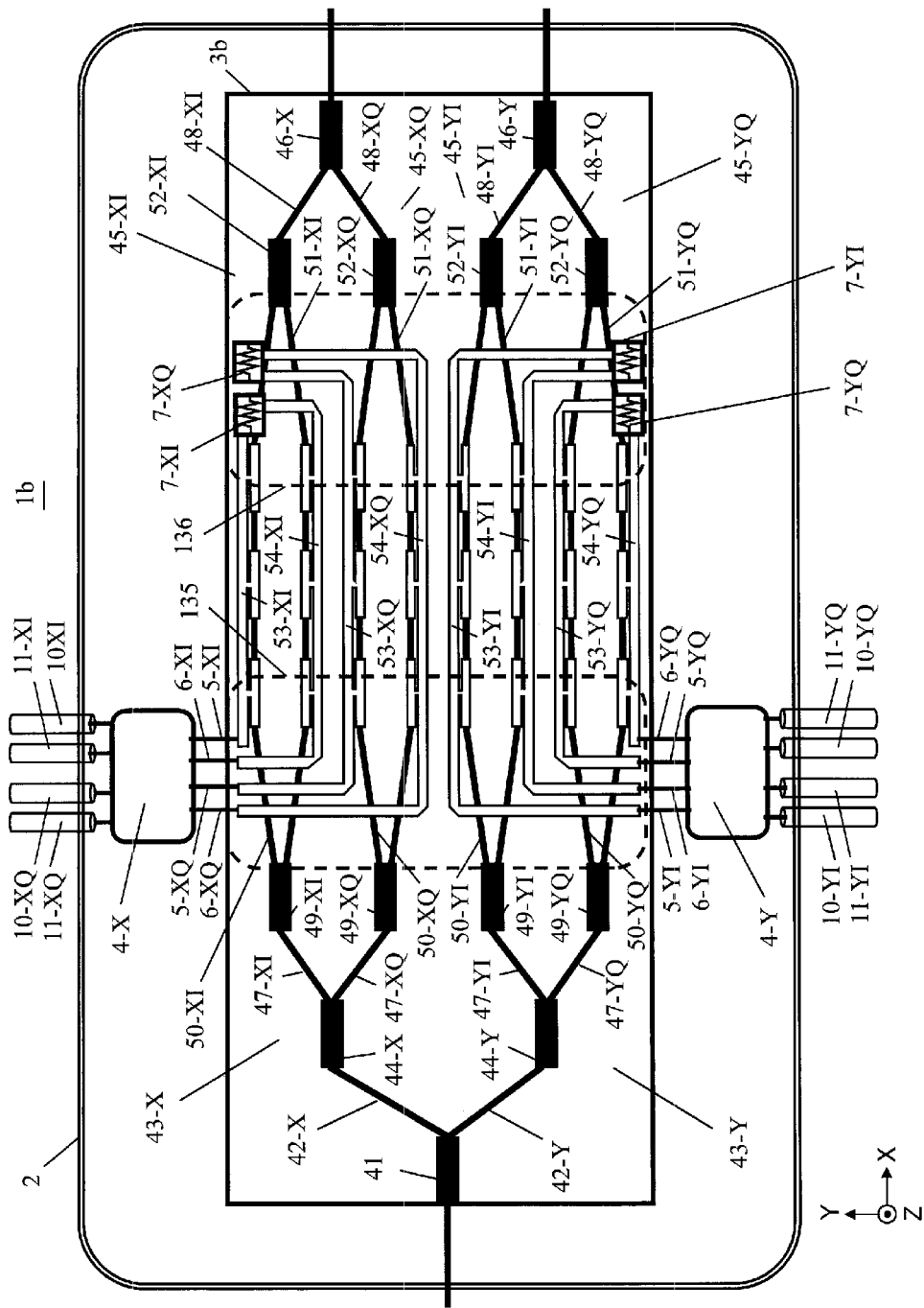
FIG. 5 is a plan view of an optical module according to a third embodiment of the present invention.

Hereinafter, a third embodiment of the present invention is described. FIG. 5 is a plan view of an optical module according to the third embodiment of the present invention. Inside a housing 2 of an optical module 1b according to the present embodiment: a Peltier module (cooling element) described later; an optical semiconductor element 3b mounted on the Peltier module; drivers 4-X, 4-Y (active elements) that drive high-frequency lines of the optical semiconductor element 3b; gold wires 5-XI, 5-XQ, 5-YI, 5-YQ, 6-XI, 6-XQ, 6-YI, 6-YQ that connect input ends of the high-frequency lines of the optical semiconductor element 3b with the drivers 4-X, 4-Y; and terminators 7-XI, 7-XQ, 7-YI, 7-YQ that terminate the high-frequency lines of the optical semiconductor element 3b are provided.

The optical semiconductor element 3b is provided with a polarization-multiplexing optical IQ modulator. The polarization-multiplexing optical IQ modulator includes: an optical demultiplexer 41 that demultiplexes input light into two; optical waveguides 42-X, 42-Y that guide the light from the optical demultiplexer 41; an X-polarization side optical IQ modulator 43-X that polarization-modulates input light from the optical waveguide 42-X in response to the driving signal on an X-polarization side; and a Y-polarization side optical IQ modulator 43-Y that polarization-modulates input light from the optical waveguide 42-Y in response to the driving signal on a Y-polarization side of which polarization state is orthogonal to that of the X-polarization side.

The X-polarization side optical IQ modulator 43-X includes: an optical demultiplexer 44-X; an I-side Mach-Zehnder optical modulator 45-XI; a Q-side Mach-Zehnder optical modulator 45-XQ; and an optical multiplexer 46-X.

The Y-polarization side optical IQ modulator 43-Y includes: an optical demultiplexer 44-Y; an I-side Mach-Zehnder optical modulator 45-YI; a Q-side Mach-Zehnder optical modulator 45-YQ; and an optical multiplexer 46-Y.

The I-side Mach-Zehnder optical modulator 45-XI includes: an optical circuit providing a function of an optical interferometer; and capacity-loaded high-frequency lines (high-frequency circuits) 53-XI, 54-XI formed on a surface of the optical circuit. The optical circuit includes: an input optical waveguide 47-XI; an output optical waveguide 48-XI; an optical demultiplexer 49-XI; optical waveguides 50-XI, 51-XI; and an optical multiplexer 52-XI.

The Q-side Mach-Zehnder optical modulator 45-XQ includes: an optical circuit providing a function of an optical interferometer; and capacity-loaded high-frequency lines (high-frequency circuits) 53-XQ, 54-XQ formed on a surface of the optical circuit. The optical circuit includes: an input optical waveguide 47-XQ; an output optical waveguide 48-XQ; an optical demultiplexer 49-XQ; optical waveguides 50-XQ, 51-XQ; and an optical multiplexer 52-XQ.

The I-side Mach-Zehnder optical modulator 45-YI includes: an optical circuit providing a function of an optical interferometer; and capacity-loaded high-frequency lines (high-frequency circuits) 53-YI, 54-YI formed on a surface of the optical circuit. The optical circuit includes: an input optical waveguide 47-YI; an output optical waveguide 48-YI; an optical demultiplexer 49-YI; optical waveguides 50-YI, 51-YI; and an optical multiplexer 52-YI.

The Q-side Mach-Zehnder optical modulator 45-YQ includes: an optical circuit providing a function of an optical interferometer; and capacity-loaded high-frequency lines (high-frequency circuits) 53-YQ, 54-YQ formed on a surface of the optical circuit. The optical circuit includes: an input optical waveguide 47-YQ; an output optical waveguide 48-YQ; an optical demultiplexer 49-YQ; optical waveguides 50-YQ, 51-YQ; and an optical multiplexer 52-YQ.

The optical demultiplexer 41 demultiplexes CW light input from the outside of the housing into two. The optical demultiplexer 44-X of the X-polarization side optical IQ modulator 43-X demultiplexes input light from the optical demultiplexer 41 into two.

The optical demultiplexer 49-XI of the I-side Mach-Zehnder optical modulator 45-XI demultiplexes input light from the optical demultiplexer 44-X into two. The driver 4-X applies the driving signal, which is input via high-frequency lines 10-XI, 11-XI from outside of the housing, to the capacity-loaded high-frequency lines 53-XI, 54-XI of the I-side Mach-Zehnder optical modulator 45-XI. The gold wires 5-XI, 6-XI electrically connect input ends of the capacity-loaded high-frequency lines 53-XI, 54-X with an output terminal of the driver 4-X.

The electrodes provided cyclically on the capacity-loaded high-frequency lines 53-XI, 54-XI apply the driving signal to the optical waveguides 50-XI, 51-XI. By applying the driving signal, light propagating along the optical waveguides 50-XI, 51-XI is modulated.

The optical multiplexer 52-XI multiplexes the light propagating along the optical waveguides 50-XI, 51-X to the output optical waveguide 48-XI.

The optical demultiplexer 49-XQ of the Q-side Mach-Zehnder optical modulator 45-XQ demultiplexes input light from the optical demultiplexer 44-X into two. The driver 4-X applies the driving signal, which is input via high-frequency lines 10-XQ, 11-XQ from outside of the housing, to the capacity-loaded high-frequency lines 53-XQ, 54-XQ of the Q-side Mach-Zehnder optical modulator 45-XQ. The gold wires 5-XQ, 6-XQ electrically connect input ends of the capacity-loaded high-frequency lines 53-XQ, 54-XQ with an output terminal of the driver 4-X.

The electrodes provided cyclically on the capacity-loaded high-frequency lines 53-XQ, 54-XQ apply the driving signal to the optical waveguides 50-XQ, 51-XQ. By applying the driving signal, light propagating along the optical waveguides 50-XQ, 51-XQ is modulated. The optical multiplexer 52-XQ multiplexes the light propagating along the optical waveguides 50-XQ, 51-XQ to the output optical waveguide 48-XQ.

The optical multiplexer 46-X multiplexes the light output from the I-side Mach-Zehnder optical modulator 45-X with the light output from the Q-side Mach-Zehnder optical modulator 45-XQ.

On the other hand, the optical demultiplexer 44-Y of the Y-polarization side optical IQ modulator 43-Y demultiplexes input light from the optical demultiplexer 41 into two.

The optical demultiplexer 49-YI of the I-side Mach-Zehnder optical modulator 45-YI demultiplexes input light from the optical demultiplexer 44-Y into two. The driver 4-Y applies the driving signal, which is input via high-frequency lines 10-YI, 11-YI from outside of the housing, to the capacity-loaded high-frequency lines 53-YI, 54-YI of the I-side Mach-Zehnder optical modulator 45-YI. The gold wires 5-YI, 6-YI electrically connect input ends of the capacity-loaded high-frequency lines 53-YI, 54-YI with an output terminal of the driver 4-Y.

The electrodes provided cyclically on the capacity-loaded high-frequency lines 53-YI, 54-YI apply the driving signal to the optical waveguides 50-YI, 51-YI. By applying the driving signal, light propagating along the optical waveguides 50-YI, 51-YI is modulated.

The optical multiplexer 52-YI multiplexes the light propagating along the optical waveguides 50-YI, 51-YI to the output optical waveguide 48-YI.

The optical demultiplexer 49-YQ of the Q-side Mach-Zehnder optical modulator 45-YQ demultiplexes input light from the optical demultiplexer 44-Y into two. The driver 4-Y applies the driving signal, which is input via high-frequency lines 10-YQ, 11-YQ from outside of the housing, to the capacity-loaded high-frequency lines 53-YQ, 54-YQ of the Q-side Mach-Zehnder optical modulator 45-YQ. The gold wires 5-YQ, 6-YQ electrically connect input ends of the capacity-loaded high-frequency lines 53-YQ, 54-YQ with an output terminal of the driver 4-Y.

The electrodes provided cyclically on the capacity-loaded high-frequency lines 53-YQ, 54-YQ apply the driving signal to the optical waveguides 50-YQ, 51-YQ. By applying the driving signal, light propagating along the optical waveguides 50-YQ, 51-YQ is modulated. The optical multiplexer 52-YQ multiplexes the light propagating along the optical waveguides 50-YQ, 51-YQ to the output optical waveguide 48-YQ.

The optical multiplexer 46-Y multiplexes the light output from the I-side Mach-Zehnder optical modulator 45-YI with the light output from the Q-side Mach-Zehnder optical modulator 45-YQ.

The terminator 7-XI terminates the capacity-loaded high-frequency lines 53-XI, 54-XI of the I-side Mach-Zehnder optical modulator 45-XI. The terminator 7-XQ terminates the capacity-loaded high-frequency lines 53-XQ, 54-XQ of the Q-side Mach-Zehnder optical modulator 45-XQ. The terminator 7-YI terminates the capacity-loaded high-frequency lines 53-YI, 54-YI of the I-side Mach-Zehnder optical modulator 45-YI. The terminator 7-YQ terminates the capacity-loaded high-frequency lines 53-YQ, 54-YQ of the Q-side Mach-Zehnder optical modulator 45-YQ.

The terminator 7-X is formed (monolithically integrated) on the surface of the optical semiconductor element 3b such that one end of the terminator 7-XI constituted of a thin film resistor is electrically connected to the output end of the capacity-loaded high-frequency line 53-XI and the other end of the terminator 7-X is electrically connected to the output end of the capacity-loaded high-frequency line 54-XI. Alternatively, the terminator 7-X may be flip-chip mounted on the surface of the optical semiconductor element 3b, such that one end of the terminator 7-X constituted of a discrete component is electrically connected to the output end of the capacity-loaded high-frequency line 53-XI and the other end of the terminator 7-X is electrically connected to the output end of the capacity-loaded high-frequency line 54-XI. Similarly, the terminators 7-XQ, 7-YI, 7-YQ are monolithically integrated or flip-chip mounted on the surface of the optical semiconductor element 3b.

In the present embodiment, unlike the first and second embodiments, due to the number of the drivers increased to two and the number of the terminators increased to four, heat-generative portions are multiplied, and the high-temperature regions 135, 136 created by heat generation in the drivers 4-X, 4-Y and the terminators 7-XI, 7-XQ, 7-YI, 7-XQ are also expanded.

FIG. 6A is a lateral view of the optical semiconductor element 3b and the Peltier module 12b, and FIG. 6B is a plan view of the Peltier module 12b. The drivers 4-X, 4-Y, the terminators 7-XI, 7-XQ, 7-YI, 7-XQ, and the gold wires 5-XI, 5-XQ, 5-YI, 5-YQ, 6-XI, 6-XQ, 6-YI, 6-YQ are omitted in FIG. 6A. In addition, electrodes of a thermoelectric semiconductor etc. of the Peltier module 12b are omitted in FIG. 6A. FIG. 6B shows a perspective view of the inside of the Peltier module 12b.

The operation principle of the Peltier module 12b is the same as that of the Peltier module 12 in the first embodiment. The optical semiconductor element 3b is mounted on the substrate 15 on a cooling side of the Peltier module 12b.

In the present embodiment, in a region in the in-plane direction of a joint face (the upper face of the substrate 15, which is the XY plane in FIG. 6B) of the Peltier module 12b with respect to the optical semiconductor element 3b, the pairs of p-type thermoelectric semiconductors 13 and n-type thermoelectric semiconductors 14 are densely arranged in regions 137, 138 immediately below the two high-temperature regions 135, 136 of the optical semiconductor element 3b, while the pairs of p-type thermoelectric semiconductors 13 and n-type thermoelectric semiconductors 14 are sparsely arranged in regions other than the regions 137, 138. In the present embodiment, such an arrangement selectively changes the cooling performance of the Peltier module 12b in such a way that the cooling performance in the region 137 in vicinity of the drivers 4-X, 4-Y and the region 138 in vicinity of the terminators 7-XI, 7-XQ, 7-YI, 7-XQ is higher than the cooling performance in other regions.

As described above, in the present embodiment, the in-plane temperature distribution of the optical semiconductor element 3b can be uniformized during operation of the optical module 1b and the variation in the respective interference conditions of the I-side Mach-Zehnder optical modulators 45-XI, 45-YI and the Q-side Mach-Zehnder optical modulators 45-XQ, 45-YQ can be suppressed, enabling stable operation of the I-side Mach-Zehnder optical modulators 45-XI, 45-YI and the Q-side Mach-Zehnder optical modulators 45-XQ, 45-YQ as in the first embodiment.

Note that, although the present embodiment is targeted at the optical module in which the optical semiconductor element 3b, the drivers 4-X, 4-Y, and the terminators 7-XI, 7-XQ, 7-YI, 7-XQ are mounted in a single housing, the present embodiment may also be applied to the optical module in which the driver is outside the housing as shown in FIG. 7. In this case, there is only one high-temperature region indicated by 136.

It goes without saying that, in the first to third embodiments, a semiconductor material constituting the Mach-Zehnder optical modulators 30, 45-XI, 45-YI, 45-XQ, 45-YQ does not need to be particularly limited. Various semiconductor materials including InGaAsP/InP type materials or GaAs/GaAlAs type materials may be applied for the Mach-Zehnder optical modulators 30, 45-XI, 45-YI, 45-XQ, 45-YQ.

Similarly, it goes without saying that a cross-sectional structure of the optical waveguides constituting the Mach-Zehnder optical modulators 30, 45-XI, 45-YI, 45-XQ, 45-YQ does not need to be particularly limited. Various optical waveguide structures such as the high-mesa structure, the ridge structure, and the rib structure may be applied.

It also goes without saying that characteristic impedance to be matched in impedance matching between the drivers 4, 4-X, 4-Y and the capacity-loaded high-frequency lines 37, 38, 53-XI, 53-XQ, 53-YI, 53-YQ, 54-XI, 54-XQ, 54-YI, 54-YQ, and impedance matching between the capacity-loaded high-frequency lines 37, 38, 53-XI, 53-XQ, 53-YI, 53-YQ, 54-XI, 54-XQ, 54-YI, 54-YQ and the terminators 7, 7a, 7-XI, 7-XQ, 7-YI, 7-XQ does not need to be limited. Especially when the drivers 4, 4-X, 4-Y are open collector type drivers in the configuration in which the drivers 4, 4-X, 4-Y and the optical semiconductor elements 3, 3b are integrated, matching to 50Ω for a single phase mode and 100Ω for a differential mode is not necessary in light of improvement of modulation efficiency.

In addition, arrangement of the pairs of p-type thermoelectric semiconductors 13 and n-type thermoelectric semiconductors 14 in the Peltier modules 12, 12a, 12b is not limited to the arrangement mentioned in the first to third embodiments. It is only required to figure out non-uniformity of the in-plane temperature distribution of the optical semiconductor elements 3, 3b due to the high-temperature regions 131, 133, 135, 136 in advance, and to arrange the pairs of p-type thermoelectric semiconductors 13 and n-type thermoelectric semiconductors 14 such that the non-uniformity can be resolved.

In the example shown in FIG. 4B, the pairs of p-type thermoelectric semiconductors 13 and n-type thermoelectric semiconductors 14 are arranged in substantially the same pattern in the regions 132, 134; however, it goes without saying that the arrangement maybe in different patterns in the regions 132, 134 according to difference in temperature of the high-temperature regions 131, 133 immediately above. Similarly in the example shown in FIG. 6B, the pairs of p-type thermoelectric semiconductors 13 and n-type thermoelectric semiconductors 14 are arranged in the same pattern in the regions 137, 138; however, it goes without saying that the arrangement may be in different patterns.

In addition, in the first to third embodiments, the pairs of p-type thermoelectric semiconductors 13 and n-type thermoelectric semiconductors 14 are arranged in two levels, that is dense and sparse; however, it goes without saying that, for example in the regions 132, 134, 137, 138 immediately below the high-temperature regions 131, 133, 135, 136, density and sparsity of the pairs of p-type thermoelectric semiconductors 13 and n-type thermoelectric semiconductors 14 may change in a plurality of levels.

Furthermore, in the first to third embodiments, there are two high-temperature regions in the optical semiconductor elements 3, 3b; however, also in the case in which there are three or more high-temperature regions, the pairs of p-type thermoelectric semiconductors 13 and n-type thermoelectric semiconductors 14 may be arranged such that the non-uniformity of the in-plane temperature distribution of the optical semiconductor element can be resolved.

INDUSTRIAL APPLICABILITY

Embodiments of the present invention can be applied to an optical module mounted with an optical modulator.

REFERENCE SIGNS LIST

1, 1a, 1b Optical module
2 Housing
3, 3b Optical semiconductor element
4, 4-X, 4-Y Driver
5, 5-XI, 5-XQ, 5-YI, 5-YQ, 6, 6-XI, 6-XQ, 6-YI, 6-YQ Gold wire
7, 7a, 7-XI, 7-XQ, 7-YI, 7-XQ Terminator
12, 12a, 12b Peltier module
13 P-type thermoelectric semiconductor
14 N-type thermoelectric semiconductor
30 Mach-Zehnder optical modulator
31, 47-XI, 47-XQ, 47-YI, 47-YQ Input optical waveguide
32, 48-XI, 48-XQ, 48-YI, 48-YQ Output optical waveguide
33, 34, 42-XC, 42-Y, 50-XI, 50-XQ, 50-YI, 50-YQ, 51-XI, 51-XQ, 51-YI, 51-YQ Optical waveguide
35, 41, 44-X, 44-Y, 49-XI, 49-XQ, 49-YI, 49-YQ Optical demultiplexer
36, 46-X, 46-Y, 52-XI, 52-XQ, 52-YI, 52-YQ Optical multiplexer
37, 38, 53-XI, 53-XQ, 53-YI, 53-YQ, 54-XI, 54-XQ, 54-YI, 54-YQ Capacity-loaded high-frequency line
39, 40 Electrode
43-X X-polarization side optical IQ modulator
43-Y Y-polarization side optical IQ modulator
45-XI, 45-YI I-side Mach-Zehnder optical modulator
45-XQ, 45-YQ Q-side Mach-Zehnder optical modulator.

The invention claimed is:

1. An optical module comprising:
a cooling element;
an optical semiconductor element mounted on the cooling element; and
a driver configured to drive a high-frequency circuit of the optical semiconductor element,
wherein the optical semiconductor element comprises:
an optical circuit configured to provide an optical interferometer; and
the high-frequency circuit on a surface of the optical circuit;
wherein the optical circuit includes two optical waveguides;
wherein a cooling performance of the cooling element is higher in a first region than in other regions, the first region being immediately below a region through which one of the two optical waveguides passes; and
wherein the first region is a region in a vicinity of the driver.

2. The optical module according to claim 1,
wherein the cooling element is a Peltier module including pairs of p-type thermoelectric semiconductors and n-type thermoelectric semiconductors arranged two-dimensionally along an in-plane direction of a joint face with respect to the optical semiconductor element; and
wherein within a region in the in-plane direction, a density of the pairs of p-type thermoelectric semiconductors and n-type thermoelectric semiconductors in the region of the driver is higher than a density of the pairs of p-type thermoelectric semiconductors and n-type thermoelectric semiconductors in the other regions.

3. The optical module according to claim 1,
wherein the optical circuit and the high-frequency circuit constitute a Mach-Zehnder optical modulator.

4. An optical module comprising:
a cooling element;
an optical semiconductor element mounted on the cooling element; and
a terminator configured to terminate a high-frequency circuit of the optical semiconductor element,
wherein the optical semiconductor element includes:

an optical circuit configured to provide an optical interferometer; and the high-frequency circuit on a surface of the optical circuit;

wherein the optical circuit includes two optical waveguides;

wherein a cooling performance of the cooling element is higher in a second region than in other regions, the second region being immediately below a region through which one of the two optical waveguides passes; and wherein the second region is a region in a vicinity of the terminator.

5. The optical module according to claim 4, wherein the cooling element is a Peltier module including pairs of p-type thermoelectric semiconductors and n-type thermoelectric semiconductors arranged two-dimensionally along an in-plane direction of a joint face with respect to the optical semiconductor element; and wherein within a region in the in-plane direction, a density of the pairs of p-type thermoelectric semiconductors and n-type thermoelectric semiconductors in the region of the terminator is higher than a density of the pairs of p-type thermoelectric semiconductors and n-type thermoelectric semiconductors in the other regions.

6. The optical module according to claim 4, wherein the terminator is monolithically integrated with a surface of the optical semiconductor element.

7. The optical module according to claim 4, wherein the terminator is flip-chip mounted on a surface of the optical semiconductor element.

8. The optical module according to claim 4, wherein the optical circuit and the high-frequency circuit constitute a Mach-Zehnder optical modulator.

9. An optical module comprising:

a cooling element;

an optical semiconductor element mounted on the cooling element;

a driver configured to drive a high-frequency circuit of the optical semiconductor element; and a terminator configured to terminate the high-frequency circuit, in which: the optical semiconductor element includes an optical circuit providing a function of an optical interferometer and the high-frequency circuit formed on a surface of the optical circuit;

wherein the optical circuit includes two optical waveguides;

wherein a cooling performance of the cooling element is higher in a third region than in other regions, the third region being immediately below a region through which one of the two optical waveguides passes; and wherein the third region includes a first region in a vicinity of the driver and a second region in a vicinity of the terminator.

10. The optical module according to claim 9, wherein the cooling element is a Peltier module including pairs of p-type thermoelectric semiconductors and n-type thermoelectric semiconductors arranged two-dimensionally along an in-plane direction of a joint face with respect to the optical semiconductor element; and wherein within a region in the in-plane direction, densities of the pairs of p-type thermoelectric semiconductors and n-type thermoelectric semiconductors in the region in a vicinity of the driver and the region of the terminator are higher than a density of the pairs of p-type thermoelectric semiconductors and n-type thermoelectric semiconductors in the other regions.

11. The optical module according to claim 9, wherein the terminator is monolithically integrated with a surface of the optical semiconductor element.

12. The optical module according to claim 9, wherein the terminator is flip-chip mounted on a surface of the optical semiconductor element.

13. The optical module according to claim 9, wherein the optical circuit and the high-frequency circuit constitute a Mach-Zehnder optical modulator.

\* \* \* \* \*